United States Patent [19]

Kowalski

[11] Patent Number: 5,060,198
[45] Date of Patent: Oct. 22, 1991

[54] DEVICE FOR THE STRUCTURAL TESTING OF AN INTEGRATED CIRCUIT

[75] Inventor: Jacek Kowalski, Trets, France

[73] Assignee: SGS - Thomson Microelectronics S.A., Gentilly, France

[21] Appl. No.: 587,512

[22] Filed: Sep. 24, 1990

Related U.S. Application Data

[63] Continuation of Ser. No. 258,813, Oct. 17, 1988, abandoned.

[30] Foreign Application Priority Data

Oct. 19, 1987 [FR] France ................................. 87 14344

[51] Int. Cl.$^5$ ............................................. G11C 29/00
[52] U.S. Cl. ................................ 365/201; 365/189.08; 365/230.06; 371/21.1; 371/22.1; 371/25.1; 371/21.2
[58] Field of Search ............. 365/189.08, 201, 230.06; 324/73 AT; 371/21.1, 21.2, 22.1, 25.1

[56] References Cited

U.S. PATENT DOCUMENTS

| | | | |
|---|---|---|---|
| 4,481,627 | 11/1984 | Beauchesne et al. | 371/21.1 |
| 4,603,405 | 7/1986 | Michael | 365/201 |
| 4,720,818 | 1/1988 | Takeguchi | 365/201 |
| 4,742,989 | 5/1988 | Hoffmann | 365/201 |
| 4,752,929 | 6/1988 | Kantz et al. | 365/201 |
| 4,829,520 | 5/1989 | Toth | 371/22.1 |

FOREIGN PATENT DOCUMENTS 0104442  4/1984  European Pat. Off. .

OTHER PUBLICATIONS

Integration to VLSI Journal, vol. 2, 12/84, pp. 309-330, K. K. Saluja et al., "Testable Design of Large Random Access Memories".

Electro and Mini/Micro, 4/23-25/85, pp. 1-4, S. Grossman, "Testing Today's EEPROMs".

*Primary Examiner*—Glenn Gossage
*Attorney, Agent, or Firm*—Roland Plottel

[57] ABSTRACT

Between a bit line decoder and the memory of an integrated circuit, there is interposed a gate circuit which is cascade-connected with a logic block of the integrated circuit. This arrangement makes possible the structural testing of the integrated circuit. Structural testing means to read and check the response given on the outputs of the logic blocks for a given state imposed on its inputs. This arrangement results in a reduction of the space required on the integrated circuit for testing, when compared with other solutions, which require specific connection circuits. This arrangement is particularly adapted to integrated circuits with a memory and with decoders that provide access to the memory. The arrangement will find particular application in the testing of memory cards where EPROM or EEPROM circuits are used.

7 Claims, 2 Drawing Sheets

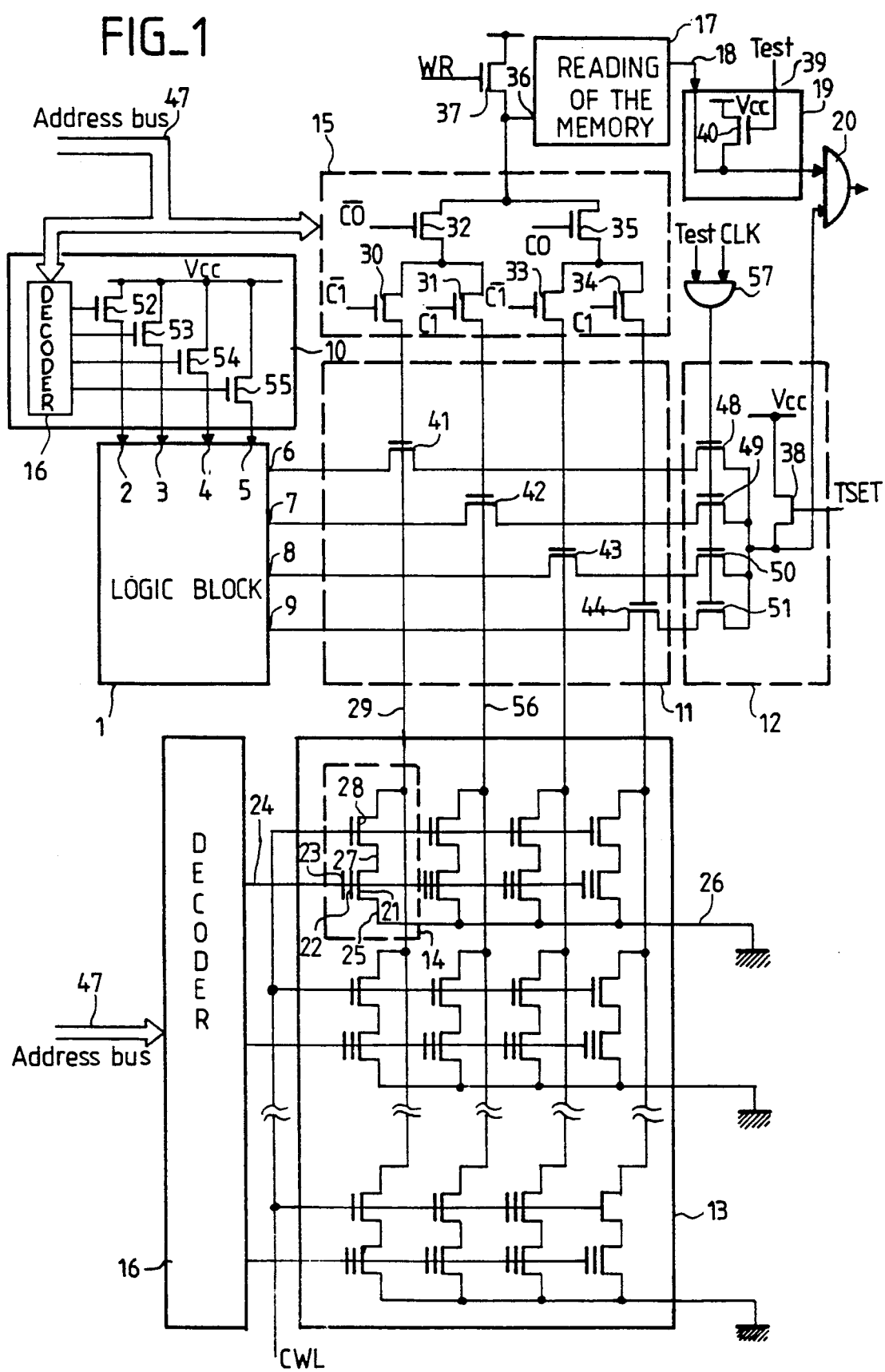

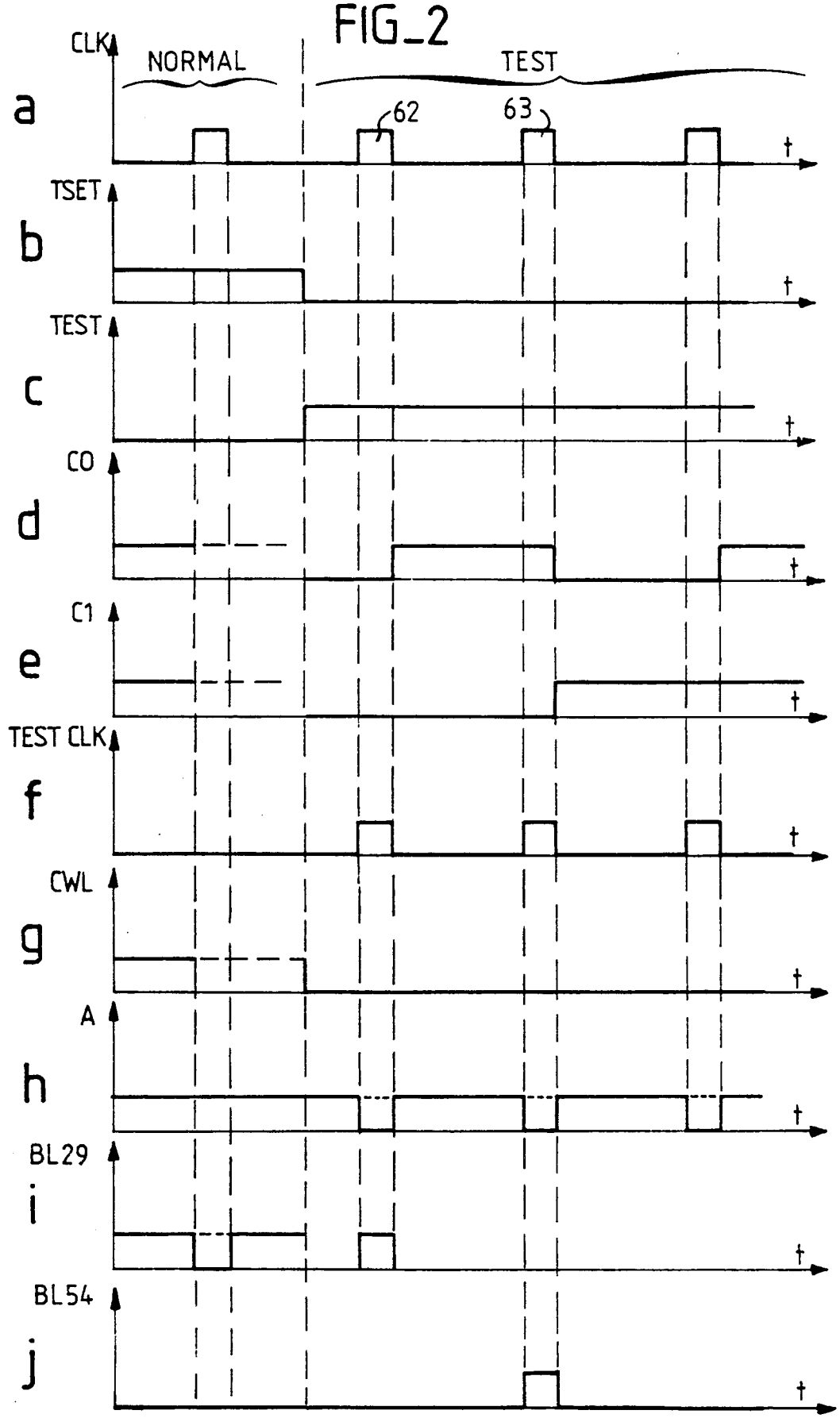

5,060,198

DEVICE FOR THE STRUCTURAL TESTING OF AN INTEGRATED CIRCUIT

This application is a continuation, of application Ser. No. 07/258,813, filed Oct. 17, 1988 now abandoned.

BACKGROUND OF THE INVENTION

1. Field of the Invention

An object of the present invention is a device for the structural testing of an integrated circuit. It can be applied in the field of semiconductors and, more particularly, in the field of memory cards, called chip cards, provided with electronic integrated circuits to fulfill various functions such as identification, electronic keying functions, storage of information, including information on bank balances etc. An object of the invention is to improve the design of these circuits in order to increase the density of the electronic functions integrated into the same circuit.

2. Description of the Prior Art

Advances in integrated circuit technology are making it possible to design increasingly complex and low-cost circuits. These two factors, complexity and cost, are resulting in an increase in the cost of testing the manufactured circuits. Thus, it is worthwhile to add internal testing circuits. These testing circuits reduce the testing time and, therefore, the overall cost of the total integrated circuit. The addition of internal testing circuits of this type nevertheless, increases the area of the total circuit. Consequently, the area for these testing circuits should be relatively small so that the reduction in the cost of testing is not wiped out by the increase in the cost of manufacturing the circuit. For, the cost of manufacturing a circuit is essentially related to the size of this circuit: the bigger the circuit, the smaller the number of circuits which can be manufactured at the same time; the more advanced, the costlier, the machines will be to manufacture them.

The cost of testing is related chiefly to the testing time. In order to reduce this testing time, structural tests are performed. Structural tests do not correspond to a check on the overall function of an integrated circuit, but rather to a check on the function of internal logic blocks, each logic block being tested separately.

A logic block can be defined as a circuit with inputs and outputs. In response to signals applied to its inputs, it has to deliver expected output signals. The structural test therefore includes introducing input signals of this type, and checking the form of the output signals delivered. Logic blocks are not necessarily organized in such a way as to end, through their inputs and/or outputs, in connection terminals of the total integrated circuit. For, during the normal operation of this total integrated circuit, the signals delivered by these logic blocks, which are then activated by integrated circuit managing signals, do not need to be extracted in most cases. Hence, if a structural test enables a considerable reduction in testing time, and also an exhaustive checking of the behavior of the circuit in all possible situations, it still requires an external reading of all the outputs of all the logic blocks to be tested. This may result in considerable loss of space, and in a corresponding complexity of the total integrated circuit. Ultimately, the gain in testing speed may be counter-balanced by a loss of space, and a smaller capacity of the manufactured circuit.

In practice, this difficulty can be resolved partially by using, a shift register in series which enables the recording, of the signals given by the parallel outputs of a logic block to be tested in series. Thus, the number of connections to be made in the circuit is reduced by the ratio of this parallel/series conversion. However, the shift register itself occupies a great deal of space, especially if the number of bits, namely the number of pulse signals, is great.

In the invention, these drawbacks are overcome by noting that some of the electronic integrated circuits to be tested have memories. To provide access to the memory cells of these memories, these circuits have decoders. The idea of the invention lies in the use of these already existing decoders to control the distribution of the input and/or output signals of the logic blocks to be tested. In the invention, gate circuits, mounted in cascade with the logic blocks and controlled by outputs of the decoder, are simply interposed between the memory and these decoders. In organizing a particular address decoding, it is possible to validate the operation of these gate circuits in such a way that all the functions of a logic block are tested successively or at least in such a way that the signals resulting from the performance of the functions of this logic block are taken into account successively. In one improvement, even the output circuit of the memory is used as an organ for the transmission of test signals by interposing, in series, with the output circuit of the memory, a circuit to neutralize the normal functions of this memory and a circuit to activate the transmission of the signals resulting from the execution of the logic functions.

SUMMARY OF THE INVENTION

An object of the invention, therefore, is a device for the structural testing of an integrated circuit.

According to an aspect of the invention, there is provided a device to perform structural tests on logic blocks of integrated circuits. Logic test signals are introduced in the logic blocks, and a check is made of the form of output signals delivered by the logic blocks. There is a memory with memory cells, and a decoder circuitry provides access to memory cells of said memory through a selection of a bit line and a word line of a memory cell to be accessed, wherein the logic out signals are delivered through a first gate circuit having one transistor per output of said logic blocks, each transistor having its drain connected to a respective output of the logic blocks, its control gate connected to an associated output of the decoder circuitry of the memory and its source connected to an output circuit of the integrated circuit.

BRIEF DESCRIPTION OF THE DRAWINGS

The invention will be better understood from the following description and the appended figures. These figures are given purely as an indication and in no way restrict the scope of the invention. Of these figures:

FIG. 1 shows a structural testing device according to the invention;

FIG. 2 shows timing diagrams (a)–(j) of signals used to implement the device of the invention.

DESCRIPTION OF A PREFERRED EMBODIMENT

FIG. 1 shows a device for the structural testing of an integrated circuit according to the invention. This integrated circuit essentially has logic blocks such as 1, provided with inputs 2 to 5 and outputs 6 to 9. It has a circuit 10 to introduce sequences of logic test signals in these logic blocks. It has means 11, 12, to deliver logic signals resulting from the passage of the test signals in the blocks. Finally, it has a memory 13 which includes a plurality of memory cells, such as 14, accessible by an access decoder. To simplify the description, the access decoder has, a bit line decoder 15 and a word line decoder 16. These two decoders receive address signals of the cells of the memory transmitted by a bus 47. The characteristic feature of the invention is the fact that the introducing and/or delivering means, in this case the delivering means, have a gate circuit 11 cascade-mounted, downline, with the logic block 1. This gate circuit is controlled by the decoder of the memory: in practice, it is the bit line decoder.

In one improvement of the invention, the circuits of the memory have a circuit 17 for reading the content of the memory cells of the memory. This reading circuit 17 has an output 18 which transmits the information read. The improvement includes in interposing, in the output connection 18, a circuit 19 to neutralize the transmission of the information signals read. This neutralization circuit works in a way which is complementary with a circuit 12 that activates the transmission of the test signals. An AND gate 20 is used to collect these signals of read and tested information and, depending on the prevailing operational mode (normal mode or test mode) of the integrated circuit, can transmit the two signals produced.

In a special application of the memory cards, the memory 13 will have EEPROM type memory cells 14, which includes a transistor 21 with a floating gate 22, and a control gate 23 which is controlled by an output 24 of the decoder 16 of word lines, and the source 25 of which is connected to a main ground connection 26 and the drain 27 of which is connected to the source of a control transistor 28. The control gate of this control transistor 28 is connected to a circuit delivering a word lines selection signal CWL. The drain of the control transistor 28 is connected to a bit line 29. Memory cell 14 is ultimately identified by the intersection of bit lines 29 and word lines 24. The example shown in FIG. 1 is a simple example: the memory 13 has a number of bit lines limited to four. This simplification provides a better understanding of the invention.

With only four bit lines, the bit line decoder 15 has to decode only two address bits: the bits C0 and C1. To this end, this decoder 15 may conventionally have a set of six transistors 30 to 35 organized hierarchically to receive the signals C0, C1, C0 and C1. For example, if C0 and C1 are at zero, the transistors 32 and 30 are series-connected and conductive at the same time. Consequently, in this example, the bit line 29 is connected alone to a bias potential VCC of the memory as well as to an input 36 of the memory reading circuit 17. The bias potential VCC is applied by a biasing circuit which, in a standard way, comprises a biasing transistor 37 receiving the biasing command signal WR.

FIG. 2 shows timing diagrams (a)-(j) of the normal operation of the integrated circuit provided with its memory as well as the modification of this operation resulting from the test operations. In normal operation, a signal TEST, validating the test, is at zero and its complementary signal TSET is at one [waveforms (c), and in FIG. 2(b) respectively]. Under these conditions, the activation circuit 12 which has, at the output, a transistor 38 controlled by the signal TSET and which is biased by the supply Vcc of the total integrated circuit, delivers, at the input of the AND gate 20, a signal one ("1") regardless of the state of the outputs of the gate circuit 11. The read operation neutralizing circuit 19 is de-activated at this moment. It is de-activated, for example, by the reception of the TEST signal at the input 39 of its transistor 40. It then transmits the signals detected by the memory reading circuit 17 in response to address signals C0 or C1 transmitted by the bus 47 to the decoder 15 (bit lines) and 16 (word lines).

The normal functioning of the memory managing circuit is organized under the synchronization of a clock (not shown) giving a signal CLK. At the rate of the signals of this clock, the potential applied to the selected bit lines (the potential BL29 applied to the bit line 29 for example) is maintained or breaks down (i.e. is held at one logic level, e.g. "1" or changes to another logic level, e.g. "0"), depending on the programming state of the floating gates 22 of the floating gate transistors 21 of the selected memory cells 14. This holding or breakdown (i.e. held at one or changed to another logic level) signal is naturally transmitted up to the output of the gate 20. The neutralizing circuit 19 has a transistor 40 that operates similarly to the transistor 38 of the activation circuit 12, although it is controlled by a complementary polarity signal.

During operation in test mode, the signals TEST and TSET have reverse polarities with respect to their polarity in normal mode. The gate circuit 11 essentially has gates, taking the form of the transistors 41 to 44. The role of these gates is to allow the transmission, during test mode operation, of signals coming from the outputs 6 to 9 of the logic block 1 towards the input of the gate 20. Each transistor 41 to 44 is respectively series-connected, by drain and source, between an input of the activation circuit 12 and a corresponding output of the logic block 1. The control gates of the transistors 41 to 44 are each connected to one of the bit lines such as 29. The activation circuit 12 further has an OR gate provided with four inputs and having four other transistors 48 to 51. These other transistors are all connected, firstly, to a common terminal connected to an input of the gate 20 and to the source of the transistor 38. They are connected, secondly, to a corresponding one of the transistors 41 to 44 controlling the transmission of the signals available at the output of the logic block 1. The control gates of the transistors 48 to 51 are controlled by an AND gate 57 which receives, at its inputs, the test signal TEST and the clock signal CLK. Waveform (f) in FIG. 2 indicates the periods, during operation in test mode, when the circuit 12 effectively activates the gate circuit 11.

In order not to discharge the bit lines leading to programmed cells (and there are usually programmed cells), or to avoid electrical action on the cells connected to this bit line (such electrical action would limit the lifetime for which the information is maintained or might cause unwanted programming), the signal CWL for commanding the selection of all the word lines is set to zero during the testing operations (waveform (g) in FIG. 2). The result of this is that all the control transistors 28 of each of the memory cells 14 of the memory are blocked during this testing period. Consequently, all the drains 27 of the floating gate transistors 21 are unconnected. No charges can migrate between these drain connections and the floating gates. The zero-setting of the signal CWL thus causes the selection of all the memory cells of the memory to be neutralized. Hence, not only is the reading of the memory neutralized with the circuit 19 (this circuit 19 delivers an output signal which validates the working of the AND gate 20) but, also, the memory 13 is itself protected.

In testing mode, the structural testing device works as follows. The circuit 10 introduces the test input signals at the inputs 2 to 5 of the logic block 1. The outputs 6 to 9 of this logic block are then carried to levels that reveal the function of this logic block. Through the address bus 47, each of the bit lines, such as the bit line 29, is then selected successively. Consequently, the transistors 41 to 44 are each closed in turn. For example, at the start, when C0 and C1 equal zero, the bit line 29 is taken to one for a period corresponding to the duration of the clock pulse CLK which occurs while these signals C0 and C1 are in this state. During this period, the transistor 41 is closed as is the OR gate formed by the four transistors 48 to 51. This OR gate receives, through the transistor 48, the signal given by the output 6 of the logic block 1. This signal is then transmitted to the AND gate 20.

The clock signals may be used to increment the values of the address signals. It can be arranged that, after a first clock pulse 62, at a following clock pulse 63, the signal C0 flips while the signal C1 is maintained (FIG. 2). Under these conditions, a following bit line, the bit line 54, is chosen. The transistor 42 controlled by this bit line goes on, permitting the transmission of the signal available at the output 7 of the logic block 1 to the AND gate 20. Continuing this way, the signals available in parallel at the outputs of the logic block 1 are transmitted serially. If necessary, the operation may be repeated by modifying the signals introduced by the circuit 10. A testing sequence is then performed, providing greater knowledge of how the logic block 1 works.

The invention has been described as placing the gate circuit 11 downline of the logic circuit 1 to be tested. However, it is quite possible to envision using another gate circuit in the place of the introduction circuit 10. The operation would be the same. By a decoding of address signals transmitted by the bus 47 bit line to the decoder 15 or to the word line decoder 16, the outputs of this other gate circuit could be connected to the inputs of the logic block 1. If necessary, this connection could also be made by means of another activation circuit having the same role as the activation circuit 12 in the example described. To simplify matters, this other gate circuit would have a set of transistors 52 to 55, all biased in common by the general supply Vcc of the integrated circuit and transmitting output signals depending on the decoded addresses which they would receive at their gates through the word line decoder 16. To ensure that the output signals of the logic block 1 are maintained up to the instant when the signals they deliver are used, memorizing flip-flops could be interposed in cascade with these outputs. However, to avoid the interposing of these flip flops, the other decoder, namely the word line decoder 16, could be preferably used to enable the introduction of the test signals, while the bit line decoder 15 would remain dedicated, to the reading of the tested signals.

What is claimed is:

1. A device to perform structural tests on logic blocks of an integrated circuit, the tests comprising the introduction of logic test signals in the logic blocks and a checking of the form of output signals delivered by the logic blocks, said device comprising:

said logic blocks having inputs and outputs, and performing logic functions, means for introducing logic test signals at the inputs of said logic blocks, means for delivering logic output signals accessible from the outputs of said logic blocks and resulting from the passage of said logic test signals through said logic blocks, onto an output terminal of the integrated circuit, a memory with memory cells, decoder circuitry providing access to memory cells of said memory through a selection of a bit line and a work line coupled to a memory cell to be accessed, said means for delivering comprising a first gate circuit including one transistor per output of said logic blocks, each transistor having its drain connected to a respective output of the logic blocks, its control gate connected to an associated output of the decoder circuitry of the memory and its source connected to an output circuit of the integrated circuit.

2. A device according to claim 1, wherein the decoder circuitry comprises a bit line decoder connected to a reading circuit of the memory and a word line decoder, and wherein the first gate circuit is controlled by the bit line decoder.

3. A device according to claim 1 or claim 9, wherein the means for delivering further comprises means for using a previously existing output circuit associated with a reading circuit of the memory and used during a normal read operation of the memory to transmit through said output circuit, logic output signals resulting from the passage of logic test signals through the logic blocks, said normal read operation of the memory being that performed by the integrated circuit when it is not under said tests.

4. A device according to claim 3, wherein the means for using comprises means for temporarily neutralizing the output of the reading circuit of the memory during a performance of a test, and means for activating the transmission of signals resulting from a performance of the tests, onto said output circuit associated with said reading circuit of the memory.

5. A device according to claim 1 or claim 2, further comprising means to prevent the selection of any of the memory cells of the memory during a testing operation.

6. A device according to claim 1, wherein:

said means for introducing comprises a second gate circuit including one transistor per input of the logic blocks, each transistor of said second gate circuit having its drain connected to a Vcc supply, its control gate connected to an output of the decoder circuitry of the memory and its source connected to a respective input of said logic blocks.

7. A device according to claim 6 wherein the decoder circuitry includes a bit line decoder connected to a memory reading circuit and a word line decoder, and wherein the second gate circuit is controlled by the word line decoder.

* * * * *